US012765289B2

(12) United States Patent
Zhu et al.

(10) Patent No.: US 12,765,289 B2
(45) Date of Patent: Oct. 13, 2026

(54) METHOD FOR ETCHING SILICON WAFER

(71) Applicant: BEIJING NAURA MICROELECTRONICS EQUIPMENT CO., LTD., Beijing (CN)

(72) Inventors: Haiyun Zhu, Beijing (CN); Zhongwei Jiang, Beijing (CN); Jing Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 224 days.

(21) Appl. No.: 18/252,705

(22) PCT Filed: Nov. 15, 2021

(86) PCT No.: PCT/CN2021/130553
§ 371 (c)(1),
(2) Date: May 11, 2023

(87) PCT Pub. No.: WO2022/100725
PCT Pub. Date: May 19, 2022

(65) Prior Publication Data
US 2024/0006182 A1 Jan. 4, 2024

(30) Foreign Application Priority Data
Nov. 16, 2020 (CN) ........................ 202011281017.0

(51) Int. Cl.
*H10P 50/24* (2026.01)

(52) U.S. Cl.
CPC .................................. *H10P 50/242* (2026.01)

(58) Field of Classification Search
None
See application file for complete search history.

(56) References Cited

U.S. PATENT DOCUMENTS

2007/0202700 A1 8/2007 Leucke et al.
2014/0134846 A1* 5/2014 Hirayama ......... H01L 21/31138 438/703
2016/0027546 A1* 1/2016 Teshima ................ A61B 6/032 378/154

FOREIGN PATENT DOCUMENTS

CN 101962773 A 2/2011
CN 103077920 A 5/2013
(Continued)

OTHER PUBLICATIONS

The World Intellectual Property Organization (WIPO) International Search Report for PCT/CN2021/130553 Feb. 14, 2022 5 Pages (including translation).

*Primary Examiner* — Stephanie P Duclair
(74) *Attorney, Agent, or Firm* — Anova Law Group, PLLC

(57) ABSTRACT

A method for etching a silicon wafer includes: a main etching process using a first mixed gas to perform a plasma etching process to etch the silicon wafer until a pattern on the silicon wafer reaches a specified aspect ratio, the first mixed gas being configured to etch silicon and react with silicon to form non-volatile reaction products; and an auxiliary etching process using a second mixed gas to perform another plasma etching process, the second mixed gas being configured to react with silicon to generate the non-volatile reaction products, and a formation rate of the non-volatile reaction products in the auxiliary etching process being greater than a formation rate of the non-volatile reaction products in the main etching process. The main etching process and the auxiliary etching process are alternately performed at least once until the pattern on the silicon wafer reaches a specified etching depth.

15 Claims, 4 Drawing Sheets

(56) References Cited

FOREIGN PATENT DOCUMENTS

| | | | | |
|---|---|---|---|---|
| CN | 105720002 | A | | 6/2016 |
| CN | 108364867 | A | | 8/2018 |
| CN | 110137080 | A | * | 8/2019 |
| CN | 112466749 | A | | 3/2021 |
| JP | H11135489 | | * | 5/1999 |
| JP | H11135489 | A | | 5/1999 |

* cited by examiner

METHOD FOR ETCHING SILICON WAFER

CROSS-REFERENCE TO RELATED APPLICATIONS

This application is a national phase entry of PCT Patent Application No. PCT/CN2021/130553, filed on Nov. 15, 2021, which claims the priority of Chinese Patent Application No. 202011281017.0, filed on Nov. 16, 2020, the entire contents of all of which are incorporated herein by reference.

TECHNICAL FIELD

The present disclosure relates to the technical field of semiconductor technologies and, more particularly, to a method for etching a silicon wafer.

BACKGROUND

Plasma etching process is widely used in semiconductor manufacturing process. The anisotropic etching characteristics of plasma allow the size of integrated circuit components to be further reduced, thereby laying a solid foundation for the continuous prosperity of integrated circuits for decades.

As the size of integrated circuit components continues to shrink, the limit of Moore's Law (the number of transistors that can be accommodated on an integrated circuit will double approximately every 24 months) is getting closer and closer. People attempt to make room in a vertical direction on a silicon wafer to place more electronic components. The high aspect ratio etching process may be used to produce finer micro-nano structure. But in the existing high aspect ratio etching process such as deep trench silicon etching, the etching pattern demonstrates isotropic etching, that is, severe lateral etching. For example, when using bosh process for deep silicon etching, scallop effect may appear on the sidewall of the pattern (trench or via hole), resulting in rough and uneven sidewall topography.

SUMMARY

The present disclosure intends to solve at least one of the technical problems existing in the prior art, and proposes a method for etching a silicon wafer, which solves the problem in the prior art that rough and uneven sidewall occurs in the high aspect ratio etching of silicon.

One aspect of the present disclosure provides a method for etching a silicon wafer. The method includes: a main etching process using a first mixed gas to perform a plasma etching process to etch the silicon wafer until a pattern on the silicon wafer reaches a specified aspect ratio, the first mixed gas being configured to etch silicon and react with silicon to form non-volatile reaction products; and an auxiliary etching process using a second mixed gas to perform another plasma etching process, the second mixed gas being configured to react with silicon to generate the non-volatile reaction products, and a formation rate of the non-volatile reaction products in the auxiliary etching process being greater than a formation rate of the non-volatile reaction products in the main etching process. The main etching process and the auxiliary etching process are alternately performed at least once until the pattern on the silicon wafer reaches a specified etching depth.

Optionally, the specified etching depth is smaller than a target etching depth; and after the main etching process and the auxiliary etching process are alternately performed, the main etching process is performed at least once until the pattern on the silicon wafer reaches the specified etching depth.

Optionally, the specified aspect ratio achieved after each main etching process is greater than or equal to N−1:1 and less than or equal to N:1, wherein N is a sequence number of the main etching processes.

Optionally, the specified aspect ratio is greater than or equal to 3:1 and less than or equal to 5:1.

Optionally, a duration of the auxiliary process is greater than or equal to 2 seconds and smaller than or equal to 3 seconds.

Optionally, the first mixed gas includes sulfur hexafluoride, and one or more of oxygen, hydrogen bromide, silicon tetrafluoride, and silicon tetrachloride; and the second mixed gas includes one or more of oxygen, hydrogen bromide, silicon tetrafluoride, and silicon tetrachloride.

Optionally, if the first mixed gas and the second mixed gas contain exactly the same gas types in the four gases of oxygen, hydrogen bromide, silicon tetrafluoride, and silicon tetrachloride, a flow rate of each gas included in the four gases in the first mixed gas is smaller than the flow rate of the same gas included in the four gases in the second mixed gas; and if the gas types contained in the first mixed gas and the second mixed gas are at least partially different in the four gases of oxygen, hydrogen bromide, silicon tetrafluoride, and silicon tetrachloride, a total flow rate of these four gases in the first mixed gas is less than a total flow rate of these four gases in the second mixed gas.

Optionally, the second mixed gas further includes sulfur hexafluoride.

Optionally, the first mixed gas includes four gases: sulfur hexafluoride, oxygen, hydrogen bromide, and silicon tetrafluoride; and a flow ratio of sulfur hexafluoride, oxygen, hydrogen bromide, and silicon tetrafluoride is (1.7-2.3):(1.3-1.7):(13-17):1.

Optionally, when performing the main etching process, a value range of an upper radio frequency (RF) power is greater than or equal to 300 W and less than or equal to 2,500 W, a value range of the lower RF power is greater than or equal to 15 W and less than or equal to 800 W, and a pressure in a process chamber ranges between 10 mT and 90 mT; and when performing the auxiliary etching process, a value range of an upper RF power is greater than or equal to 500 W and less than or equal to 2,000 W, a value range of the lower RF power is greater than or equal to 50 W and less than or equal to 500 W, and the pressure in the process chamber ranges between 10 mT and 100 mT.

Optionally, before the main etching process is performed for the first time, the method further includes: a pre-etching process using a pre-etching gas to perform the plasma etching process to etch the silicon wafer and remove an oxide layer on the surface of the silicon wafer.

The present disclosure provides the following beneficial effects. The method for etching the silicon wafer provided in the embodiments of the present disclosure includes alternately performing at least one main etching process and one auxiliary etching process. The first mixed gas used in the main etching process etches the silicon wafer. Both the first mixed gas and the second mixed gas used in the auxiliary etching process may react with silicon to generate the non-volatile reaction products during the etching process. The non-volatile reaction products may be attached to the sidewall and the top surface of the pattern to form the protective layer, which suppresses the isotropic etching of the silicon and ensures that the etching is anisotropic. By making the generation rate of the non-volatile reaction products in the auxiliary etching process greater than the generation rate of the non-volatile reaction products in the main etching process, more non-volatile reaction products may be generated in the auxiliary etching process in the same time period as compared with the main etching process to more effectively protect the sidewall of the pattern, such that the lateral etching in the next main etching process can be reduced. On one hand, the reduction of the lateral etching avoids the scallop effect caused by excessive lateral etching, the edge roughness on the sidewall of the pattern can be significantly improved, and the smoother sidewall appearance can be obtained to batter facilitate the growth of the gate oxide and the filling of polysilicon. On the other hand, the generation of the under cut on the top surface can be further suppressed.

DETAILED DESCRIPTION OF THE EMBODIMENTS

Figure 1:
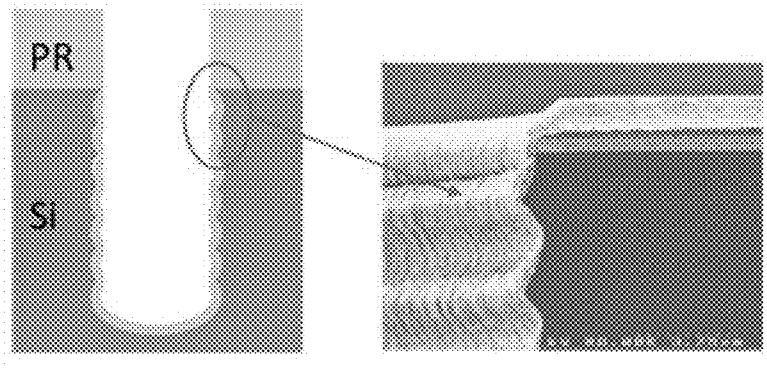
FIG. 1 is a pattern topographic diagram showing a scallop effect in the existing technology.

The present disclosure is described in detail below, and embodiments of the present disclosure are shown in the drawings. Same or similar reference numerals denote same or similar components or components having the same or similar functions throughout. In addition, detailed descriptions of known technologies will be omitted if they are not necessary to illustrate features of the present disclosure. The embodiments described below with reference to the drawings are merely exemplary for explaining the present disclosure, and should not be construed as limiting the present disclosure.

Those skilled in the art should understand that, unless otherwise defined, all terms (including technical terms and scientific terms) used herein have the same meanings as commonly understood by those of ordinary skill in the art to which the present disclosure belongs. It should also be understood that terms, such as those defined in commonly used dictionaries, should be understood to have meanings consistent with their meaning in the context of the prior art, and unless specifically defined as herein, are not intended to have idealized or overly formal meanings.

Those skilled in the art should understand that the singular forms “a”, “an” and “the” used herein may also include plural forms unless otherwise stated. When an element is referred to as being “connected” or “coupled” to another element, it can be directly connected or coupled to the other element or intervening elements may also be present. Additionally, “connected” or “coupled” as used herein may include wireless connection or wireless coupling. The expression “and/or” used herein includes all or any elements and all combinations of one or more associated listed items.

The technical solution of the present disclosure and how the technical solution of the present disclosure solves the above technical problems will be described in detail below with specific embodiments.

Figure 2:
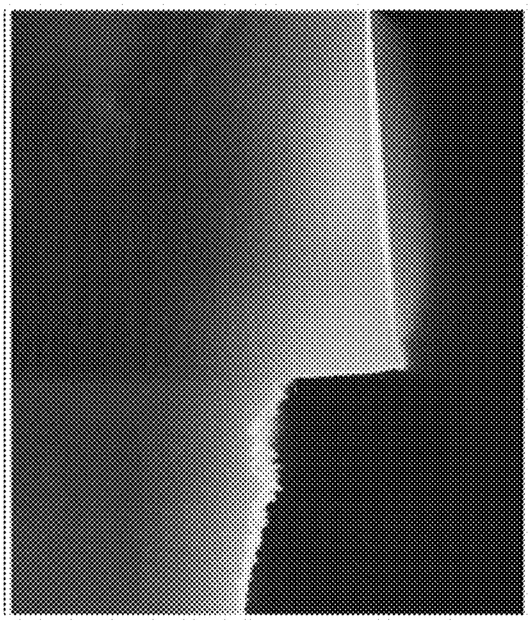
FIG. 2 is a trench topographic diagram showing under cut in the existing technology.
Figure 3:
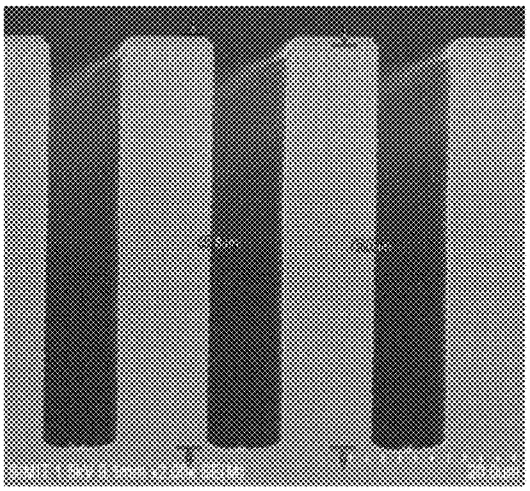
FIG. 3 is a pattern topographic diagram showing a steep sidewall in the existing technology.

Reasons for the rough and uneven sidewall appearance in a high aspect ratio etching process in the prior art are studied and analyzed below. When an etching process and a deposition process are alternately executed during the high aspect ratio etching process, due to strong chemical activity of an etching gas, an etched pattern (trench or via hole) shows isotropic etching, that is, a strong lateral etching, resulting in a substantial lateral etching. During the alternate execution of the etching process and the deposition process, a protective layer formed in the deposition process may protect the sidewall of the pattern. But the protective layer is not sufficient to suppress the isotropic etching in the etching process. Therefore, after multiple cycles, a scallop effect may occur on the sidewall as shown in FIG. 1. In addition, when an etching depth reaches a certain level, and a top of the pattern is corroded by the etching gas for a long time, an “under cut” symptom may also occur as shown in FIG. 2, and may cause loss of critical dimensions. Moreover, the alternating execution of the etching process and the deposition process can only obtain the topographic appearance with steep sidewalls as shown in FIG. 3. For power devices such as TSV (through silicon via etching), IGBT (insulated gate bipolar transistor), etc., a slightly inclined trench angle is more desirable for gate oxide generation and polysilicon addition.

Based on the above analysis and research, the present disclosure provides a method for etching a silicon wafer (hereinafter referred to as etching method), which can be applied to any plasma etching equipment, and can be applied to silicon deep hole and trench etching processes for manufacturing integrated circuits MEMS (micro-electromechanical systems), TSV, and IGBT. It is especially desirable for etching patterns with high aspect ratios on silicon wafers. The silicon wafers are wafers made of silicon. The silicon may be single crystal silicon or polycrystalline silicon. The pattern etched on the silicon wafer may be a trench with a rectangular cross-section, or a through hole or a trench with a circular cross-section, which is not limited in the present disclosure.

Figure 4:
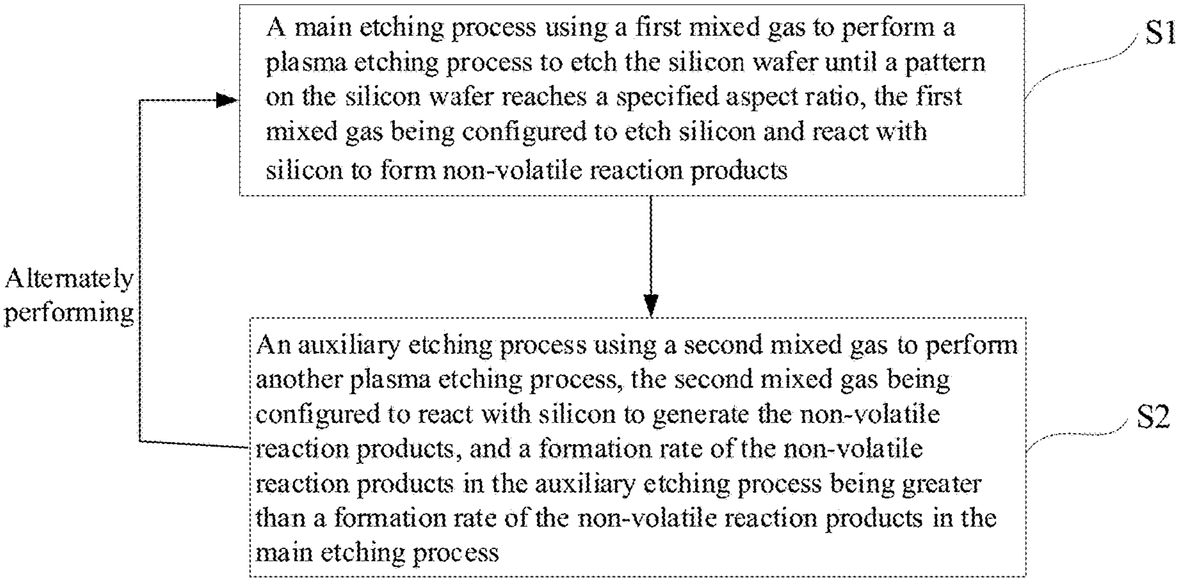
FIG. 4 is a flowchart of an exemplary method for etching a silicon wafer according to some embodiments of the present disclosure.
Figure 5A:
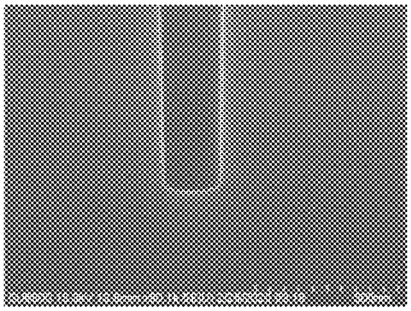
FIGS. 5A-5E are topographic views of trenches obtained by using an exemplary method for etching a silicon wafer according to some embodiments of the present disclosure.
Figure 5B:
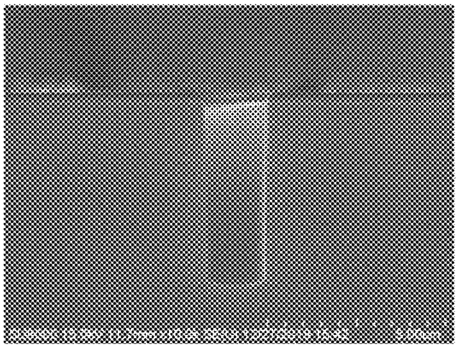
Figure 5C:
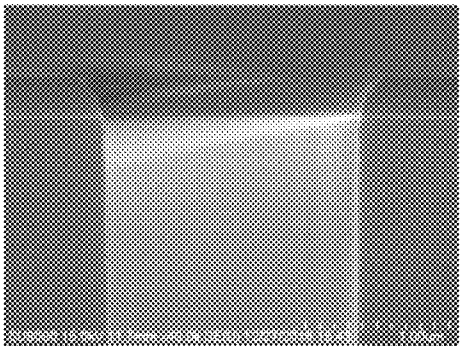
Figure 5D:
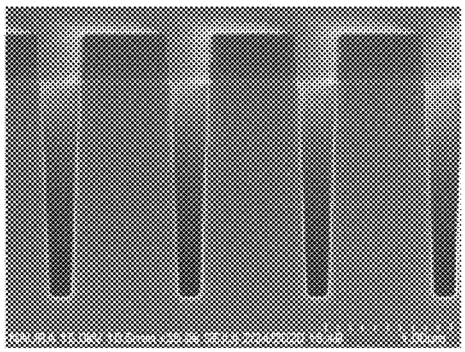
Figure 5E:
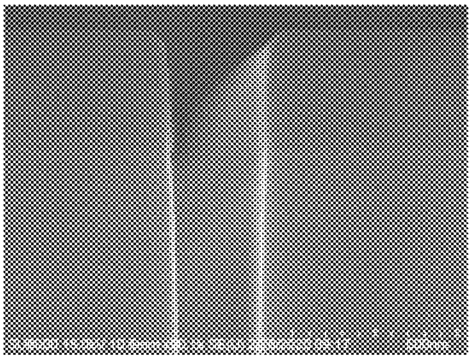

As shown in FIG. 4, the silicon wafer etching method includes the following processes.

At S1 (main etching process), a first mixed gas is used to perform a plasma etching process to etch the silicon wafer until a pattern on the silicon wafer reaches a specified aspect ratio. The first mixed gas is configured to etch silicon and react with silicon to form non-volatile reaction products.

At S2 (auxiliary etching process), a second mixed gas is used to perform another plasma etching process. The second mixed gas is configured to react with silicon to generate the non-volatile reaction products. A formation rate of the non-volatile reaction products in the auxiliary etching process is greater than a formation rate of the non-volatile reaction products in the main etching process. The main etching process S1 and the auxiliary etching process S2 are alternately performed at least once until the pattern on the silicon wafer reaches a specified etching depth.

Specifically, the above plasma etching process includes: feeding the first mixed gas into a process chamber of a semiconductor process equipment, and turning on an upper radio-frequency (RF) power supply and a lower RF power supply. An upper RF power supplied to an upper electrode by the upper RF power supply may excite the first mixed gas to form a plasma, and a lower RF power supplied to a base in the process chamber by the lower RF power supply may attract the plasma to move toward the silicon wafer. In some embodiments, an inductively coupled plasma etching device may be used to perform the above plasma etching process.

It should be noted that as the number of the main etching processes S1 increases, the etching depth of the pattern also increase continuously. Thus, the specified aspect ratios achieved by each main etching process S1 are different. In some embodiments, the specified aspect ratio to be achieved in each main etching process S1 may be estimated based on process parameters such as an etching rate, an etching duration, a gas flow rate, and the like.

The aspect ratio refers to a ratio of a depth to a width of a pattern (trench or via hole).

In some other embodiments, the specified aspect ratio achieved after each main etching process S1 is greater than or equal to N−1:1 and less than or equal to N:1, where N is a sequence number of the main etching processes. For example, the specified aspect ratio is greater than or equal to 3:1 and less than or equal to 5:1.

For example, when performing the main etching process S1 for the first time, the etching may have a specified aspect ratio of 1:1. After switching to the auxiliary etching process S2 and completing the auxiliary etching process S2 (the etching time is, for example, 2-3 seconds), the second main etching process S1 is performed. When performing the second main etching process S1, the etching is switched to the auxiliary etching process S2 when the specified aspect ratio of 2:1 is reached. After the auxiliary etching process S2 is completed, the etching is switched to the third main etching process S1. When performing the third main etching process S1, the etching is switched to the auxiliary etching process S2 when the specified aspect ratio of 3:1 is reached. The main etching process S1 and the auxiliary etching process S2 are alternately performed until the pattern on the silicon wafer reaches the specified etching depth, and then a final main etching process S1 is performed. After the final main etching process S1 is performed, the pattern with the specified etching depth is obtained.

It should be noted that the number of alternating cycles of the main etching process S1 and the auxiliary etching process S2 may be configured according to the specified etching depth and appearance requirements. For a deep silicon etching process with the high aspect ratio, the number of alternating cycles may be increased to achieve a smoother high aspect ratio pattern.

During the alternating cycles of the main etching process S1 and the auxiliary etching process S2, the non-volatile reaction products are generated and adhered to the sidewall and a top surface of the pattern to form the protective layer, which suppresses the isotropic etching of silicon and ensures an anisotropic etching of silicon (that is, the etching rate in a depth direction is substantially greater than that in a width direction, or the etching only occurs in the depth direction). At the same time, the non-volatile reaction products adhered to the sidewall of the pattern may also increase an etching selectivity ratio between the non-volatile reaction products and the mask (such as a silicon dioxide mask) to prevent the mask from being overly etched, thereby avoiding the above-described "under cut" symptom.

By reacting with the silicon to generate the non-volatile reaction products during the main etching process S1 and the auxiliary etching process S2, the etching of the silicon in the main etching process S1 and the auxiliary etching process S2 is ensured to be anisotropic, such that lateral etching can be reduced. At the same time, by making a generation rate of the non-volatile reaction products in the auxiliary etching process greater than a generation rate of the non-volatile reaction products in the main etching process, more non-volatile reaction products are generated in the auxiliary etching process S2 in a same time period than in the main etching process S1 to more effectively protect the sidewall of the pattern. Thus, the lateral etching may be reduced in subsequent main etching processes S1, that is, the auxiliary etching process S2 generates the protective layer with a sufficient thickness to reduce the lateral etching. On one hand, the reduction of the lateral etching avoids the scallop effect caused by excessive lateral etching, such that the roughness on the sidewall of the pattern can be clearly mitigated, and a smoother sidewall appearance can be obtained, which is desirable in subsequent processes of gate oxide growth and polysilicon filling. On the other hand, the occurrence of the under cut symptom on the top surface of the pattern may also be suppressed.

It should be noted that the auxiliary etching process S2 is mainly used to generate more non-volatile reaction products to reduce the lateral etching. In this case, the second mixed gas may not contain any gas that can etch the silicon, or may also contain a gas that can etch the silicon making the etching rate in the auxiliary etching process S2 smaller than the etching rate in the main etching process S1, which helps to etch a smaller amount of silicon and to generate more non-volatile reaction products at the same time. Thus, the generated amount is sufficient to cover the sidewall of the pattern entirely and to improve smoothness of the sidewall.

It should also be noted that the present disclosure does not specifically limit the etching duration of each cycle of the auxiliary etching process S2, and the etching duration of different cycles of the auxiliary etching processes S2 may be the same or different.

In some other embodiments, the specified etching depth is smaller than a target etching depth. The target etching depth is an etching depth of a finally obtained pattern. In this case, after the main etching process S1 and the auxiliary etching process S2 are alternately performed at least once, the main etching process S1 is performed again, such that the pattern on the silicon wafer reaches the target etching depth. By performing the main etching process S1 at the end of the etching, less non-volatile reaction products may be formed on the sidewall, which is more desirable to obtain a slightly inclined sidewall of the pattern. Moreover, due to the higher etching rate in the main etching process S1, the target etching depth may be reached quicker, thereby improving an overall etching efficiency.

The specified etching depth may be a value smaller than and close to the target etching depth. In practical applications, the specified etching depth may also be made equal to the target etching depth. In this case, it is not necessary to alternately perform the main etching process S1 and the auxiliary etching process S2 at least once, and then perform the main etching process S1 again at the end of the etching.

In some embodiments, the first mixed gas and the second mixed gas are of various kinds. For example, the first mixed gas may include sulfur hexafluoride (SF6), and may also include one or more of oxygen (O2), hydrogen bromide (HBr), silicon tetrafluoride, and silicon tetrachloride (SiF4). Sulfur hexafluoride (SF6) is used to etch the silicon wafer, and gases such as hydrogen bromide (HBr), silicon tetrafluoride (SiF4), silicon tetrachloride (SiCl4), and oxygen (O2) may react with the silicon (including direct and indirect reactions) to form silica SiO2, and the non-volatile reaction products (polymers) such as Si—Br—O, SiOFX, and SiOClX, etc. During the etching process, with the help of the lower RF power supplied to the base, an RF bias may be formed on the base, which attracts the plasma to etch the silicon, and at the same time attracts the non-volatile reaction products to the sidewall of the pattern (trench or via hole).

An etching principle of the first mixed gas in the process of etching the silicon (Si) is as follows.

(1) $SF_6$ is used as the etching gas, and its reaction process is as follows: $SF_6\uparrow \longrightarrow S_xF_y\uparrow + F\uparrow$, $Si+4F \longrightarrow SiF_4\uparrow$.

(2) $O_2$ reacts with Si to generate $SiO_2$, which is used to protect the sidewall.

(3) $SiF_4$ ($SiCl_4$) reacts with oxygen plasma to generate $SiOF_x$ ($SiOCl_X$) polymer, which may be attached to the sidewall and the top surface of the pattern to reduce the lateral etching. The specific reaction process is as follows: $SiF_x+O \rightarrow SiOF_x$.

(4) HBr reacts with S1 to generate Si—Br polymer, which may be attached to the sidewall of the pattern, and $O_2$ reacts with Si—Br polymer to generate $SiO_2$ and Si—Br—O polymer, which further protects the sidewall of the pattern.

In some embodiments, the first mixed gas may also include helium (He). Helium may be used as a diluent gas to adjust the flow rate of other gases under the condition of ensuring a pressure of the process chamber. For example, a flow of other gases may be decreased by increasing a flow of helium. In addition, helium, as a good heat-conducting gas, improves etching uniformity.

In some embodiments, the first mixed gas may include four gases: sulfur hexafluoride, oxygen, hydrogen bromide, and silicon tetrafluoride. The flow rates of various gases may be designed according to the above etching principle. For example, a flow ratio of sulfur hexafluoride, oxygen, hydrogen bromide, and silicon tetrafluoride is (1.7-2.3):(1.3-1.7):(13-17):1, such that various gases may fully react with each other during the etching process, the generation of non-volatile reaction products may be increased under the condition of ensuring the etching rate, and the sidewall of the pattern may be effectively protected. In some embodiments, the flow ratio of sulfur hexafluoride, oxygen, hydrogen bromide, and silicon tetrafluoride is 2:1.5:15:1, which has a desired protection effect on the sidewall of the pattern. Further, the flow rates of sulfur hexafluoride and oxygen may be greater than or equal to 10 sccm and less than or equal to 200 sccm. Hydrogen bromide may be used as an optional process adjustment gas, and the flow rate thereof may be greater than or equal to 5 sccm and less than or equal to 1,000 sccm.

In some other embodiments, when performing the main etching process S1, a value range of the upper RF power (continuous wave) output by the upper RF power supply may be greater than or equal to 300 W and less than or equal to 2,500 W, and a value range of the lower RF power (continuous wave) output by the lower RF power supply may be greater than or equal to 15 W and less than or equal to 800 W. In some embodiments, frequencies of the upper RF power supply and the lower RF power supply both may be 13.56 MHz. The pressure in the process chamber (that is, the chamber pressure) ranges approximately between 10 mT and 90 mT. A temperature range of the base (such as an electrostatic chuck) may be 100° C. or less, preferably between 20° C. and 80° C. (inclusive). A temperature range of the process chamber may be greater than or equal to 10° C. and less than or equal to 40° C.

In the etching method provided by the embodiments of the present disclosure, both the main etching process S1 and the auxiliary etching process S2 may be performed under relatively low process pressure conditions, thereby reducing energy consumption and saving resources. It should be noted that the above parameters such as power, pressure, and temperature are merely intended to be exemplary, and the present disclosure is not limited thereto.

Similar to composition of the first mixed gas, the second mixed gas may also include one or more of oxygen, hydrogen bromide, silicon tetrafluoride and silicon tetrachloride. On this basis, the second mixed gas may also contain an appropriate amount of sulfur hexafluoride for etching.

In some embodiments, if the first mixed gas and the second mixed gas contain exactly the same gas types in the four gases of oxygen, hydrogen bromide, silicon tetrafluoride, and silicon tetrachloride, the flow rate of each gas included in the four gases in the first mixed gas is smaller than the flow rate of the same gas included in the four gases in the second mixed gas. That is, the flow rate of oxygen and/or hydrogen bromide and/or silicon tetrafluoride and/or silicon tetrachloride in the main etching gas may be less than that of oxygen and/or hydrogen bromide and/or silicon tetrafluoride and/or silicon tetrachloride in the auxiliary etching gas, respectively. For example, the flow rate of oxygen in the main etching gas is less than the flow rate of oxygen in the auxiliary etching gas; or, the flow rate of hydrogen bromide in the main etching gas is less than the flow rate of hydrogen bromide in the auxiliary etching gas; or, the flow rate of silicon tetrafluoride in the main etching gas is less than the flow rate of silicon tetrafluoride in the auxiliary etching gas. If the gas types contained in the first mixed gas and the second mixed gas are at least partially different (that is, partially different or completely different) in the four gases of oxygen, hydrogen bromide, silicon tetrafluoride, and silicon tetrachloride, a total flow rate of these four gases in the first mixed gas is less than a total flow rate of these four gases in the second mixed gas. This configuration ensures that the auxiliary etching process S2 produces enough non-volatile reaction products, further reduces the lateral etching, and plays a more effective role in protecting the sidewall and the top surface of the etched pattern, thereby ensuring a desirable sidewall topographic appearance when etching the silicon with the higher aspect ratio.

In some embodiments, when the auxiliary etching process S2 is performed, the value range of the upper RF power (continuous wave) output by the upper RF power supply may be greater than or equal to 500 W and less than or equal to 2,000 W, and the value range of the lower RF power (continuous wave) output by the lower RF power supply may be greater than or equal to 50 W and less than or equal to 500 W. The frequencies of the upper RF power supply and the lower RF power supply both may be 13.56 MHz. The pressure in the process chamber (that is, the chamber pressure) is greater than or equal to 10 mT and less than or equal to 100 mT. The temperature of the process chamber may be greater than or equal to 10° C. and less than or equal to 40° C. It should be noted that the power, pressure, temperature and other parameters here are merely intended to be exemplary, and the present disclosure is not limited thereto.

In some embodiments, before performing the first main etching process S1, the etching method further includes:

a pre-etching process, in which a pre-etching gas is used to perform a plasma etching process to etch the silicon wafer and remove an oxide layer on the surface of the silicon wafer.

The pre-etching gas may include one or more combinations of carbon tetrafluoride ($CF_4$) or other fluorine-containing hydrocarbon organic gases ($CH_xF_y$) to remove the oxide layer on the silicon surface.

In some embodiments, a critical dimension of the silicon wafer is about 0.3 μm, the target etching depth of the pattern is about 1.6 μm, and the target aspect ratio is about 5:1. Referring to the Table 1 below, the etching method may be divided into four stages.

The first stage includes the pre-etching process, the first main etching process S1, and the first auxiliary etching process S2, which are performed sequentially. When performing the first main etching process S1, the etching is switched to the first auxiliary etching process S2 after the specified aspect ratio of 1:1 is reached. The etching duration of the first auxiliary etching process S2 is about 2 s to 3 s.

The second stage includes the second main etching process S1 and the second auxiliary etching process S2. When performing the second main etching process S1, the etching is switched to the second auxiliary etching process S2 until the specified aspect ratio of 2:1 is reached. The etching duration of the second auxiliary etching process S2 is about 2 s to 3 s.

The third stage includes the third main etching process S1 and the third auxiliary etching process S2. When performing the third main etching process S1, the etching is switched to the third auxiliary etching process S2 until the specified aspect ratio of 3:1 is reached. The etching duration of the third auxiliary etching process S2 is about 2 s to 3 s.

The fourth stage includes the fourth main etching process S1, the fourth auxiliary etching process S2, and the fifth main etching process S1, which are performed sequentially. When performing the fourth main etching process S1, the etching is switched to the fourth auxiliary etching process S2 until the specified aspect ratio of 4:1 is reached. The etching duration of the fourth auxiliary etching process S2 is about 2 s to 3 s. The fifth main etching process S1 is performed until the specified aspect ratio of 5:1 is reached. Thus, the etching topographic views of the smooth sidewall and top surface without the under cut can be obtained as shown in FIGS. 5A-5E.

TABLE 1

| Comparison of various stages and parameters | | |
|---|---|---|
| First stage | Pre-etching process | The chamber pressure is 8 mT, the upper RF power is 400 W, the lower RF power is 150 W, the flow rate of CF4 is 100 sccm, the temperature of the process chamber is 20° C., and the process duration is 4 s. |
| | 1st main etching process S1 | The chamber pressure is 50 mT, the upper RF power is 1,000 W, the lower RF power is 210 W, the flow rate of SF6 is 85 sccm, the flow rate of O2 is 70 sccm, the flow rate of HBr is 620 sccm (silicon tetrafluoride and silicon tetrachloride may be added in proper amount), the temperature of the process chamber is 20° C. |
| | 1st auxiliary etching process S2 | The chamber pressure is 50 mT, the upper RF power is 1,000 W, the lower RF power is 210 W, the flow rate of O2 is 70 sccm, the flow rate of HBr is 620 sccm, the flow rate of silicon tetrafluoride is 40 sccm, and the temperature of the process chamber is 20° C. |
| Second stage | 2nd main etching process S1 | The chamber pressure is 50 mT, the upper RF power is 1,000 W, the lower RF power is 210 W, the flow rate of SF6 is 85 sccm, the flow rate of O2 is 70 sccm, the flow rate of HBr is 620 sccm (silicon tetrafluoride and silicon tetrachloride may be added in proper amount), and the temperature of the process chamber is 20° C. |
| | 2nd auxiliary etching process S2 | The chamber pressure is 50 mT, the upper RF power is 1,000 W, the lower RF power is 210 W, the flow rate of O2 is 70 sccm, the flow rate of HBr is 620 sccm, the flow rate of silicon tetrafluoride is 40 sccm, and the temperature of the process chamber is 20° C. |
| Third stage | 3rd main etching process S1 | The chamber pressure is 50 mT, the upper RF power is 1,000 W, the lower RF power is 210 W, the flow rate of SF6 is 85 sccm, the flow rate of O2 is 70 sccm, the flow rate of HBr is 620 sccm (silicon tetrafluoride and silicon tetrachloride may be added in proper amount), the temperature of the process chamber is 20° C. |
| | 3rd auxiliary etching process S2 | The chamber pressure is 50 mT, the upper RF power is 1,000 W, the lower RF power is 210 W, the flow rate of O2 is 70 sccm, the flow rate of HBr is 620 sccm, the flow rate of silicon tetrafluoride is 40 sccm, and the temperature of the process chamber is 20° C. |
| Fourth stage | 4th main etching process S1 | The chamber pressure is 50 mT, the upper RF power is 1,000 W, the lower RF power is 210 W, the flow rate of SF6 is 85 sccm, the flow rate of O2 is 70 sccm, and the flow rate of HBr is 620 sccm (silicon tetrafluoride and silicon tetrachloride may be added in proper amount), the temperature of the process chamber is 20° C. |

TABLE 1-continued

| Comparison of various stages and parameters | |
|---|---|
| $4^{th}$ auxiliary etching process S2 | The chamber pressure is 50 mT, the upper RF power is 1,000 W, the lower RF power is 210 W, the flow rate of O2 is 70 sccm, the flow rate of HBr is 620 sccm, the flow rate of silicon tetrafluoride is 40 sccm, and the temperature of the process chamber is 20° C. |
| $5^{th}$ main etching process S1 | The chamber pressure is 50 mT, the upper RF power is 1,000 W, the lower RF power is 210 W, the flow rate of SF6 is 85 sccm, the flow rate of O2 is 70 sccm, and the flow rate of HBr is 620 sccm (silicon tetrafluoride and silicon tetrachloride may be added in proper amount), the temperature of the process chamber is 20° C. |

The method for etching the silicon wafer provided in the embodiments of the present disclosure includes alternately performing at least one main etching process and one auxiliary etching process. The first mixed gas used in the main etching process etches the silicon wafer. Both the first mixed gas and the second mixed gas used in the auxiliary etching process may react with silicon to generate the non-volatile reaction products during the etching process. The non-volatile reaction products may be attached to the sidewall and the top surface of the pattern to form the protective layer, which suppresses the isotropic etching of the silicon and ensures that the etching is anisotropic. By making the generation rate of the non-volatile reaction products in the auxiliary etching process greater than the generation rate of the non-volatile reaction products in the main etching process, more non-volatile reaction products may be generated in the auxiliary etching process in the same time period as compared with the main etching process to more effectively protect the sidewall of the pattern, such that the lateral etching in the next main etching process can be reduced. On one hand, the reduction of the lateral etching avoids the scallop effect caused by excessive lateral etching, the edge roughness on the sidewall of the pattern can be significantly improved, and the smoother sidewall appearance can be obtained to batter facilitate the growth of the gate oxide and the filling of polysilicon. On the other hand, the generation of the under cut on the top surface can be further suppressed.

It should be understood that, the above embodiments are merely exemplary for illustrating the operation principle of the present disclosure, but the present disclosure is not limited thereto. For those skilled in the art, various modifications and improvements may be made without departing from the spirit of the present disclosure, and these modifications and improvements are also regarded as the protection scope of the present disclosure.

In the description of the present disclosure, it should be understood that the orientations and positional relationships indicated by the terms "center", "upper", "lower", "front", "rear", "left", "right", "vertical", "horizontal", "top", "bottom", "inner", "outer", etc. are based on the orientations or positional relationships shown in the drawings, and are merely for the convenience of describing the present disclosure and simplifying the description, rather than indicating or implying that the referenced devices or elements must have a particular orientation, or must be constructed and operated in a particular orientation. Thus, they should not be construed as limiting the present disclosure.

The terms "first" and "second" are used for descriptive purposes only, and should not be understood as indicating or implying relative importance or implicitly specifying the quantity of indicated technical features. Thus, a feature defined as "first" and "second" may explicitly or implicitly include one or more of these features. In the description of the present disclosure, unless otherwise specified, "plurality" means two or more.

In the description of the present disclosure, it should be noted that unless otherwise specified and limited, the terms "installation", "attaching", and "connection" should be understood in a broad sense. For example, it may be a fixed connection, a detachable connection, or an integrally connected connection. It may be directly connected, or indirectly connected through an intermediary. It may be the internal connection of two elements. Those of ordinary skill in the art should understand the specific meanings of the above terms in the present disclosure in specific situations.

In the description of the specification, specific features, structures, materials or characteristics may be combined in any one or more embodiments or examples in an appropriate manner.

The above descriptions are only some implementations of the present disclosure. It should be pointed out that for those of ordinary skill in the art, improvements and modifications can be made without departing from the spirit of the present disclosure. These improvements and modifications should be regarded as within the protection scope of the present disclosure.

What is claimed is:

1. A method for etching a silicon wafer, comprising:

a main etching process using a first mixed gas to perform a plasma etching process to etch the silicon wafer until a pattern on the silicon wafer reaches a specified aspect ratio, the first mixed gas being configured to etch silicon and react with silicon to form non-volatile reaction products; and an auxiliary etching process using a second mixed gas to perform another plasma etching process, the second mixed gas being configured to react with silicon to generate the non-volatile reaction products, and a formation rate of the non-volatile reaction products in the auxiliary etching process being greater than a formation rate of the non-volatile reaction products in the main etching process;

wherein:

the main etching process and the auxiliary etching process are alternately performed at least once until the pattern on the silicon wafer reaches a specified etching depth;

the specified etching depth is smaller than a target etching depth;

after the pattern on the silicon wafer reaches the specified etching depth, the main etching process is performed until the pattern on the silicon wafer reaches the target etching depth;

the first mixed gas includes sulfur hexafluoride, and one or more of oxygen, hydrogen bromide, silicon tetrafluoride, and silicon tetrachloride;

the second mixed gas includes one or more of oxygen, hydrogen bromide, silicon tetrafluoride, and silicon tetrachloride;

if the first mixed gas and the second mixed gas contain exactly the same gas types in the four gases of oxygen, hydrogen bromide, silicon tetrafluoride, and silicon tetrachloride, a flow rate of each gas included in the four gases in the first mixed gas is smaller than the flow rate of the same gas included in the four gases in the second mixed gas; and if the gas types contained in the first mixed gas and the second mixed gas are at least partially different in the four gases of oxygen, hydrogen bromide, silicon tetrafluoride, and silicon tetrachloride, a total flow rate of these four gases in the first mixed gas is less than a total flow rate of these four gases in the second mixed gas.

2. The method according to claim 1, wherein:

after the main etching process and the auxiliary etching process are alternately performed, the main etching process is performed at least once until the pattern on the silicon wafer reaches the specified etching depth.

3. The method according to claim 1, wherein:

the specified aspect ratio achieved after each main etching process is greater than or equal to N−1:1 and less than or equal to N:1, wherein N is a sequence number of the main etching processes.

4. The method according to claim 3, wherein:

the specified aspect ratio is greater than or equal to 3:1 and less than or equal to 5:1.

5. The method according to claim 1, wherein:

a duration of the auxiliary process is greater than or equal to 2 seconds and smaller than or equal to 3 seconds.

6. The method according to claim 1, wherein:

the second mixed gas further includes sulfur hexafluoride.

7. The method according to claim 1, wherein:

the first mixed gas includes four gases: sulfur hexafluoride, oxygen, hydrogen bromide, and silicon tetrafluoride; and a flow ratio of sulfur hexafluoride, oxygen, hydrogen bromide, and silicon tetrafluoride is (1.7-2.3):(1.3-1.7):(13-17):1.

8. The method according to claim 7, wherein:

the flow ratio of sulfur hexafluoride, oxygen, hydrogen bromide, and silicon tetrafluoride is 2:1.5:15:1.

9. The method according to claim 1, wherein:

when performing the main etching process, a value range of an upper radio frequency (RF) power is greater than or equal to 300 W and less than or equal to 2,500 W, a value range of the lower RF power is greater than or equal to 15 W and less than or equal to 800 W, and a pressure in a process chamber ranges between 10 mT and 90 mT; and when performing the auxiliary etching process, a value range of an upper RF power is greater than or equal to 500 W and less than or equal to 2,000 W, a value range of the lower RF power is greater than or equal to 50 W and less than or equal to 500 W, and the pressure in the process chamber ranges between 10 mT and 100 mT.

10. The method according to claim 9, wherein:

frequencies of the upper and lower RF powers are 13.56 MHz in both the main etching process and the auxiliary etching process.

11. The method according to claim 9, wherein:

when performing the main etching process, a temperature range of a base in the process chamber is less than or equal to 100° C., and a temperature range of the process chamber is greater than or equal to 10° C. and less than or equal to 40° C.; and when performing the auxiliary etching process, the temperature range of the process chamber is greater than or equal to 10° C. and less than or equal to 40° C.

12. The method according to claim 11, wherein:

when performing the main etching process, the temperature range of the base in the process chamber is greater than or equal to 20° C. and less than or equal to 80° C.

13. The method according to claim 1, further comprising before the main etching process is performed for the first time:

a pre-etching process using a pre-etching gas to perform the plasma etching process to etch the silicon wafer and remove an oxide layer on the surface of the silicon wafer.

14. The method according to claim 13, wherein:

the pre-etching gas includes one or more combinations of carbon tetrafluoride or other fluorine-containing hydrocarbon organic gases.

15. A method for etching a silicon wafer, comprising:

a main etching process using a first mixed gas to perform a plasma etching process to etch the silicon wafer until a pattern on the silicon wafer reaches a specified aspect ratio; and an auxiliary etching process using a second mixed gas to perform another plasma etching process, the second mixed gas being configured to react with silicon to generate the non-volatile reaction products, and an etching rate of the second mixed gas on the silicon wafer being smaller than an etching rate of the first mixed gas on the silicon wafer;

wherein:

in different main etching processes, the specified aspect ratio is different;

the first mixed gas includes at least one gas being able to react with silicon to form non-volatile reaction products, and a formation rate of the non-volatile reaction products in the auxiliary etching process being greater than a formation rate of the non-volatile reaction products in the main etching process;

the second mixed gas includes one or more of oxygen, hydrogen bromide, silicon tetrafluoride, and silicon tetrachloride;

the first mixed gas includes sulfur hexafluoride, oxygen, hydrogen bromide, and silicon tetrafluoride, and a flow ratio of sulfur hexafluoride, oxygen, hydrogen bromide, and silicon tetrafluoride is (1.7-2.3):(1.3-1.7):(13-17):1; and the first mixed gas and the second mixed gas satisfy at least one of:

a flow rate of the oxygen in the first mixed gas is smaller than a flow rate of the oxygen in the second mixed gas;

a flow rate of the hydrogen bromide in the first mixed gas is smaller than a flow rate of the hydrogen bromide in the second mixed gas; or a flow rate of the silicon tetrafluoride in the first mixed gas is smaller than a flow rate of the silicon tetrafluoride in the second mixed gas.

* * * * *